(12) United States Patent
Nakata et al.

(10) Patent No.: US 11,848,298 B2
(45) Date of Patent: Dec. 19, 2023

(54) SEMICONDUCTOR APPARATUS, POWER MODULE, AND MANUFACTURING METHOD OF SEMICONDUCTOR APPARATUS

(71) Applicant: Mitsubishi Electric Corporation, Tokyo (JP)

(72) Inventors: Yosuke Nakata, Tokyo (JP); Yuji Sato, Tokyo (JP); Yoshinori Yokoyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 313 days.

(21) Appl. No.: 17/401,863

(22) Filed: Aug. 13, 2021

(65) Prior Publication Data
US 2022/0238476 A1 Jul. 28, 2022

(30) Foreign Application Priority Data

Jan. 25, 2021 (JP) .................................. 2021-009779

(51) Int. Cl.
*H01L 23/00* (2006.01)
*H01L 25/065* (2023.01)
(Continued)

(52) U.S. Cl.
CPC .............. *H01L 24/48* (2013.01); *H01L 21/56* (2013.01); *H01L 23/3107* (2013.01);
(Continued)

(58) Field of Classification Search
None
See application file for complete search history.

(56) References Cited

U.S. PATENT DOCUMENTS

2021/0398950 A1* 12/2021 Nakata .................. H01L 23/142
2022/0028839 A1* 1/2022 Nakata .................... H01L 24/26

FOREIGN PATENT DOCUMENTS

WO 2020/110170 A1 6/2020

* cited by examiner

*Primary Examiner* — Michelle Mandala
*Assistant Examiner* — Jordan M Klein
(74) *Attorney, Agent, or Firm* — Studebaker & Brackett PC

(57) ABSTRACT

A semiconductor apparatus includes: a first conductor plate; a second conductor plate separated from the first conductor plate; a plurality of semiconductor devices having back surface electrodes connected to the first conductor plate; a relay substrate mounted on the second conductor plate and including a plurality of first relay pads and a second relay pad connected to the plurality of first relay pads; a plurality of metal wires respectively connecting control electrodes of the plurality of semiconductor devices to the plurality of first relay pads; a first conductor block connected to front surface electrodes of the plurality of semiconductor devices; a second conductor block connected to the second relay pad; and a sealing material sealing the first and second conductor plates, the plurality of semiconductor devices, the relay substrate, the metal wire, and the first and second conductor blocks, the sealing material includes a first principal surface and a second principal surface opposed to each other, the first conductor plate is exposed from the first principal surface, the second conductor plate is not exposed from the first principal surface, and the first and second conductor blocks are exposed from the second principal surface.

11 Claims, 22 Drawing Sheets

(51) Int. Cl.
*H01L 23/495* (2006.01)
*H01L 23/31* (2006.01)
*H01L 25/00* (2006.01)
*H01L 21/56* (2006.01)

(52) U.S. Cl.
CPC ........ *H01L 23/49575* (2013.01); *H01L 24/29* (2013.01); *H01L 24/32* (2013.01); *H01L 24/83* (2013.01); *H01L 24/85* (2013.01); *H01L 25/0655* (2013.01); *H01L 25/50* (2013.01); *H01L 2224/29084* (2013.01); *H01L 2224/32245* (2013.01); *H01L 2224/48227* (2013.01); *H01L 2224/85205* (2013.01); *H01L 2924/37001* (2013.01)

SEMICONDUCTOR APPARATUS, POWER MODULE, AND MANUFACTURING METHOD OF SEMICONDUCTOR APPARATUS

BACKGROUND OF THE INVENTION

Field

The present disclosure relates to a semiconductor apparatus, a power module, and a manufacturing method of the semiconductor apparatus.

Background

A plurality of chips are connected in parallel in a module using an SiC MOSFET to increase current capacity, because it is difficult to increase an area of the SiC MOSFET. A semiconductor apparatus has been proposed in which a plurality of semiconductor devices and wiring devices are joined on the same conductor plate and control electrodes of the plurality of semiconductor devices are connected in parallel in a circuit pattern of the wiring devices (see, for example, WO 2020/110170).

SUMMARY

An oxide film is provided on the wiring devices to achieve insulation between a front surface and a back surface. This oxide film maintains insulation between a conductor plate which is a drain potential and a circuit pattern which is a control potential in the semiconductor apparatus in related art. However, a thicker oxide film is required for, for example, a high-withstand voltage semiconductor apparatus for driving electric railroads to secure insulation. This increases manufacturing cost, degrades productivity due to difficulty in a production process in which an oxide film is laminated to make a thick oxide film, and degrades reliability of the thick oxide film which is laminated. For example, in a case where TEOS is laminated to make a thick film, manufacturability and quality degrade and, for example, a wafer warps, the film peels, or a surface gets rough. It is not typical in a normal process of a power semiconductor to laminate an oxide film to achieve an insulating film having a withstand voltage of equal to or higher than 1.7 kV. It is therefore difficult to improve dielectric strength of a semiconductor apparatus in related art.

The present disclosure has been made to solve the problem as described above, and an object of the present disclosure is to provide a semiconductor apparatus which is capable of easily improving dielectric strength, a power module, and a manufacturing method of the semiconductor apparatus.

A semiconductor apparatus according to the present disclosure includes: a first conductor plate; a second conductor plate separated from the first conductor plate; a plurality of semiconductor devices having back surface electrodes connected to the first conductor plate; a relay substrate mounted on the second conductor plate and including a plurality of first relay pads and a second relay pad connected to the plurality of first relay pads; a plurality of metal wires respectively connecting control electrodes of the plurality of semiconductor devices to the plurality of first relay pads; a first conductor block connected to front surface electrodes of the plurality of semiconductor devices; a second conductor block connected to the second relay pad; and a sealing material sealing the first and second conductor plates, the plurality of semiconductor devices, the relay substrate, the metal wire, and the first and second conductor blocks, the sealing material includes a first principal surface and a second principal surface opposed to each other, the first conductor plate is exposed from the first principal surface, the second conductor plate is not exposed from the first principal surface, and the first and second conductor blocks are exposed from the second principal surface.

In the present disclosure, the first conductor plate on which the plurality of semiconductor devices are mounted is separated from the second conductor plate on which the relay substrate is mounted, and the first conductor plate and the second conductor plate are sealed by the sealing material. Then, the first conductor plate is exposed from the first principal surface of the sealing material while the second conductor plate is not exposed from the first principal surface of the sealing material. This can achieve insulation between the first conductor plate and the second conductor plate, so that it is possible to easily improve dielectric strength.

Other and further objects, features and advantages of the invention will appear more fully from the following description.

DESCRIPTION OF EMBODIMENTS

A semiconductor apparatus, a power module, and a manufacturing method of the semiconductor apparatus according to the embodiments of the present disclosure will be described with reference to the drawings. The same components will be denoted by the same symbols, and the repeated description thereof may be omitted.

First Embodiment

Figure 1:
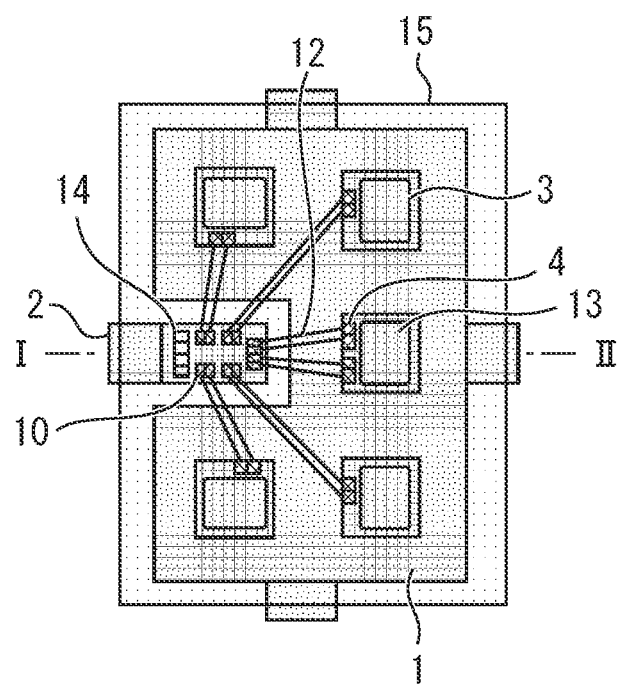
FIG. 1 is a plan view illustrating inside of a semiconductor apparatus according to a first embodiment.
Figure 2:
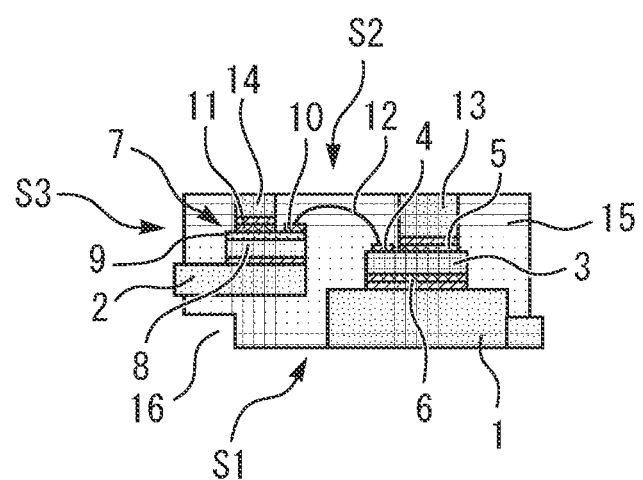
FIG. 2 is a cross-sectional view along I-II in FIG. 1.

FIG. 1 is a plan view illustrating inside of a semiconductor apparatus according to a first embodiment. FIG. 2 is a cross-sectional view along I-II in FIG. 1. A second conductor plate 2 is separated from a first conductor plate 1. A plurality of semiconductor devices 3 are mounted on the first conductor plate 1. Each of the semiconductor devices 3 includes a control electrode 4 and a front surface electrode 5 on a front surface and includes a back surface electrode 6 on a back surface. In a case where the semiconductor device 3 is a MOSFET, the control electrode 4 is a gate electrode, the front surface electrode 5 is a source electrode, and the back surface electrode 6 is a drain electrode.

The back surface electrodes 6 of the plurality of semiconductor devices 3 are connected to the first conductor plate 1. One relay substrate 7 is mounted on the second conductor plate 2. Note that a plurality of relay substrates 7 may be mounted on the second conductor plate 2.

Joining films are provided on back surfaces of the back surface electrodes 6 of the semiconductor devices 3 and the relay substrate 7. The joining films are, for example, laminated films which are formed with Ti/Ni/Ti/Au (or Ag) from the device side and which are layers formed through a sputtering method, or laminated films which are formed with NiP/Pd/Au from the device side and which are layers formed through a plating method. The joining films are connected to the first conductor plate 1 or the second conductor plate 2 through sintering joining using silver or diffusion joining using solder. Note that in a case of less heat history before joining and less Ni precipitation on an outermost surface, Ti or Pd may be omitted from compositions of the joining films. Note that a material of the first conductor plate 1 and the second conductor plate 2 is a metal such as copper.

The semiconductor device 3 is a MOSFET including a plurality of control electrodes 4 such as a gate pad, a Kelvin source pad, a temperature sensing diode pad and a current sensing source pad. Note that the Kelvin source pad, the temperature sensing diode pad, the current sensing source pad, or the like, is provided as necessary as the control electrode 4.

The relay substrate 7 is, for example, a device for wiring in which an insulating film 9 is formed on a substrate 8 formed with silicon and a circuit pattern is drawn on the insulating film 9. The relay substrate 7 includes a plurality of first relay pads 10 and a second relay pad 11 connected to the plurality of first relay pads 10 with internal wirings as the circuit pattern. The internal wirings are, for example, aluminum wirings patterned on the insulating film 9 of the relay substrate 7.

The control electrodes 4 of the plurality of semiconductor devices 3 are respectively connected to the plurality of first relay pads 10 with a plurality of metal wires 12. The metal wires 12 are, for example, fine wires formed with gold or silver and have a diameter of equal to or less than 100 µmϕ. Note that use of a wire having a diameter of equal to or less than 50 µmϕ can lower a height of a loop, so that it is possible to reduce a resin thickness.

First conductor blocks 13 are connected to the front surface electrodes 5 of the plurality of semiconductor devices 3. Second conductor blocks 14 are connected to the second relay pad 11. The first conductor blocks 13 and the second conductor blocks 14 are metal blocks and are, for example, blocks formed with copper. The first conductor blocks 13 and the second conductor blocks 14 are respectively connected to the front surface electrodes 5 and the second relay pad 11, for example, through sintering joining using silver or diffusion joining using solder. Note that the second relay pad 11 may be larger than the first relay pad 10 to absorb dimension tolerance of the second conductor blocks 14 or tolerance upon joining.

By further forming joining films on the aluminum wirings of the front surface electrodes 5, it is possible to improve joining properties with the first conductor blocks 13. Further, by further forming joining films on part of the first and second relay pads 10 and 11 of the relay substrate 7, it is possible to improve connectivity respectively with the metal wires 12 and the second conductor blocks 14. The joining films are, for example, laminated films which are formed with Ti/Ni/Ti/Au (or Ag) from the device side and which are layers formed through a sputtering method, or laminated films which are formed with NiP/Pd/Au from the device side and which are layers formed through a plating method.

Figure 3:
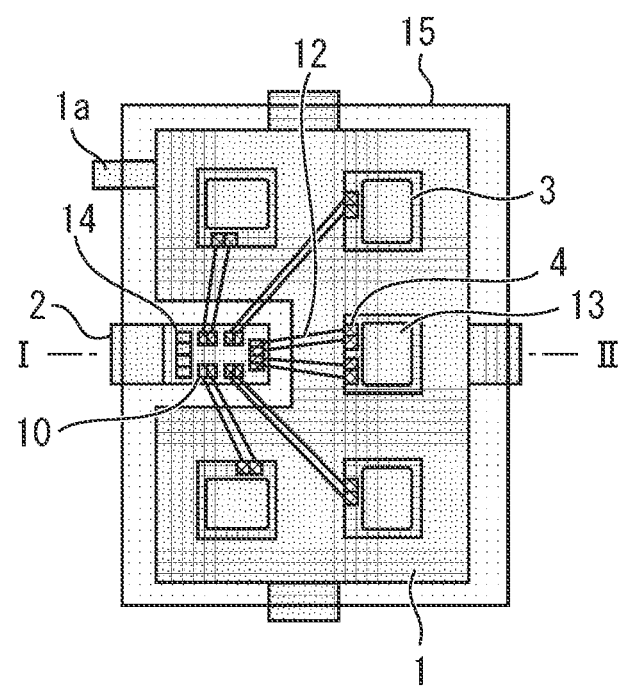
FIG. 3 is a plan view illustrating inside of a semiconductor apparatus according to a modified example of the first embodiment.

A sealing material 15 seals the first and second conductor plates 1 and 2, the plurality of semiconductor devices 3, the relay substrate 7, the metal wires 12, and the first and second conductor blocks 13 and 14. The sealing material 15 includes a first principal surface S1 and a second principal surface S2 opposed to each other, and a side surface S3. The first conductor plate 1 is exposed from the first principal surface S1. The second conductor plate 2 is not exposed from the first principal surface S1 and is exposed from the side surface S3. The second conductor plate 2 may be exposed from the second principal surface S2. The first and second conductor blocks 13 and 14 are exposed from the second principal surface S2. Electric signals are exchanged between inside and outside of the apparatus via the first and second conductor blocks 13 and 14 exposed from the sealing material 15. Note that FIG. 3 is a plan view illustrating inside of a semiconductor apparatus according to a modified example of the first embodiment. A part 1a of the first conductor plate 1 which is made to have a terminal shape protruding from the sealing material 15 can be utilized as a drain sense terminal. The drain sense terminal outputs a drain voltage as monitor output, and thus can, for example, monitor a voltage between a drain and a source during ON of the semiconductor device 3 and can detect unsaturation (overcurrent such as short-circuit) as one of overcurrent detection functions by a protection circuit being provided outside the apparatus.

The semiconductor devices 3 and the relay substrate 7 are sealed by the sealing material 15, and the first conductor plate 1 is insulated from the second conductor plate 2 by the sealing material 15. Note that the sealing material 15 may be any insulating material and is, for example, an epoxy resin. A dent portion 16 is provided on the first principal surface S1 of the sealing material 15 below the second conductor plate 2.

Subsequently, a manufacturing method of the semiconductor apparatus according to the first embodiment will be described. FIGS. 4, 6, 8, 10, 12, 14, 16, 18 and 20 are plan views illustrating a manufacturing process of the semiconductor apparatus according to the first embodiment. FIGS. 5, 7, 9, 11, 13, 15, 17, 19 and 21 are cross-sectional diagrams illustrating the manufacturing process of the semiconductor apparatus according to the first embodiment.

Figure 4:
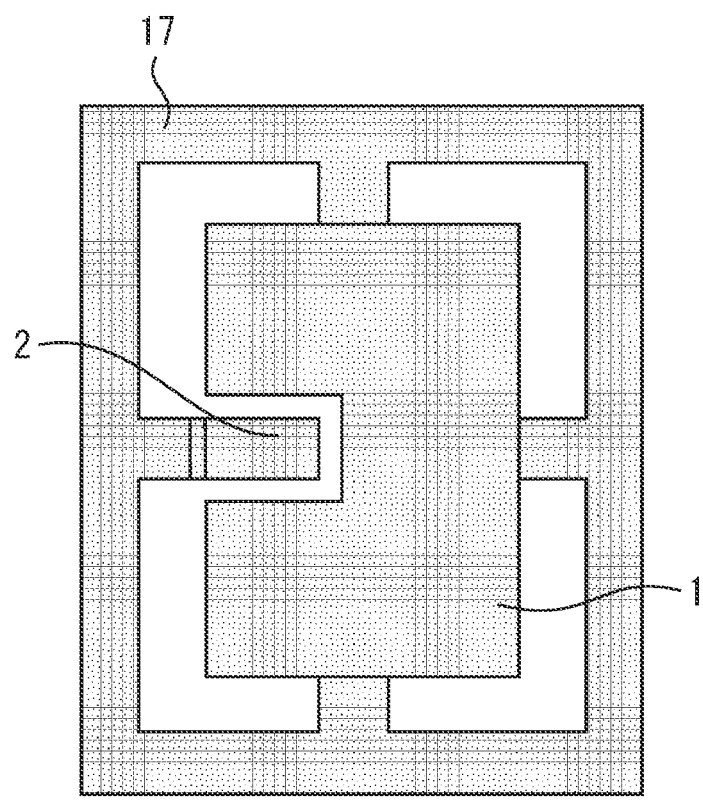
FIG. 4 is a plan view illustrating a manufacturing process of the semiconductor apparatus according to the first embodiment.
Figure 5:
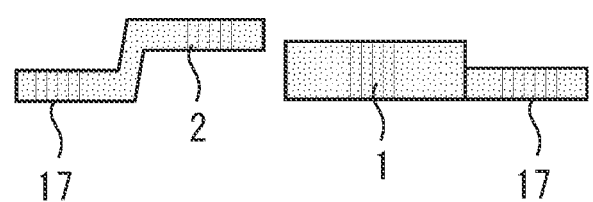
FIG. 5 is a cross-sectional diagram illustrating the manufacturing process of the semiconductor apparatus according to the first embodiment.
Figure 6:
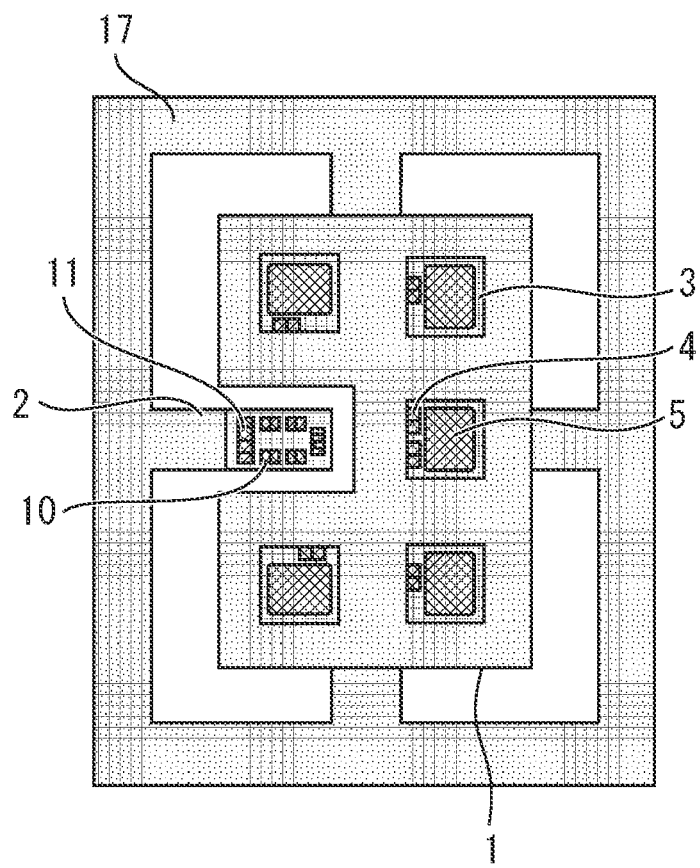
FIG. 6 is a plan view illustrating a manufacturing process of the semiconductor apparatus according to the first embodiment.
Figure 7:
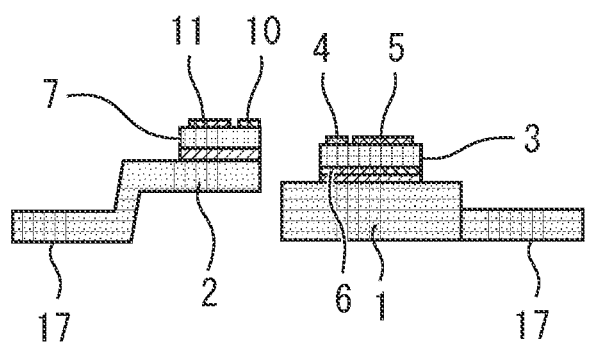
FIG. 7 is a cross-sectional diagram illustrating the manufacturing process of the semiconductor apparatus according to the first embodiment.

First, as illustrated in FIG. 4 and FIG. 5, the first conductor plate 1 and the second conductor plate 2 which are integrated with an external frame 17 and which are separated from each other are prepared. Then, as illustrated in FIG. 6 and FIG. 7, the back surface electrodes 6 of the plurality of semiconductor devices 3 are connected to the first conductor plate 1 using silver, solder, or the like, to connect the plurality of semiconductor devices 3 to the first conductor plate 1. The relay substrate 7 is connected to the second conductor plate 2 in a similar manner. Note that description of the connection method will be omitted to avoid duplication.

Figure 8:
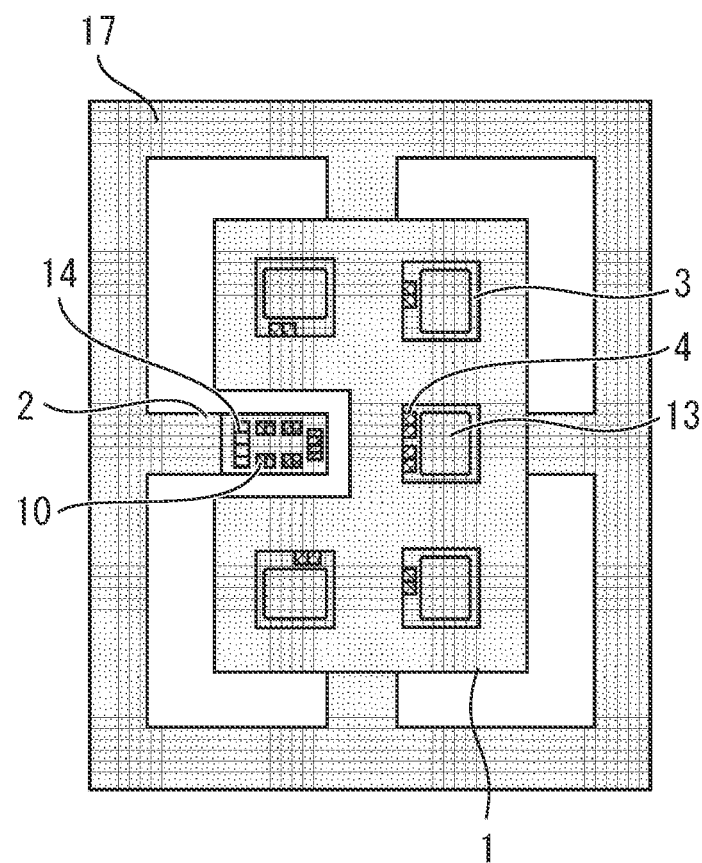
FIG. 8 is a plan view illustrating a manufacturing process of the semiconductor apparatus according to the first embodiment.
Figure 9:
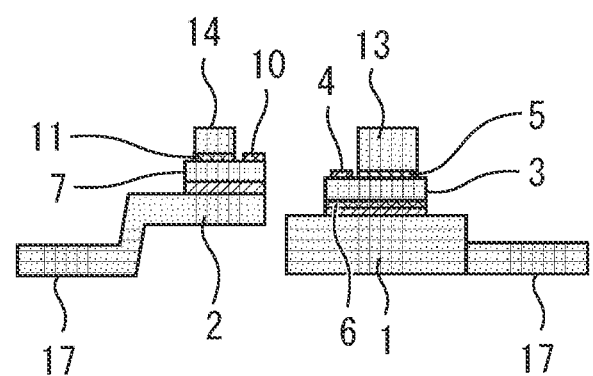
FIG. 9 is a cross-sectional diagram illustrating the manufacturing process of the semiconductor apparatus according to the first embodiment.

Then, as illustrated in FIG. 8 and FIG. 9, the first conductor blocks 13 are connected to the front surface electrodes 5 of the plurality of semiconductor devices 3. The second conductor blocks 14 are connected to the second relay pad 11.

Figure 10:
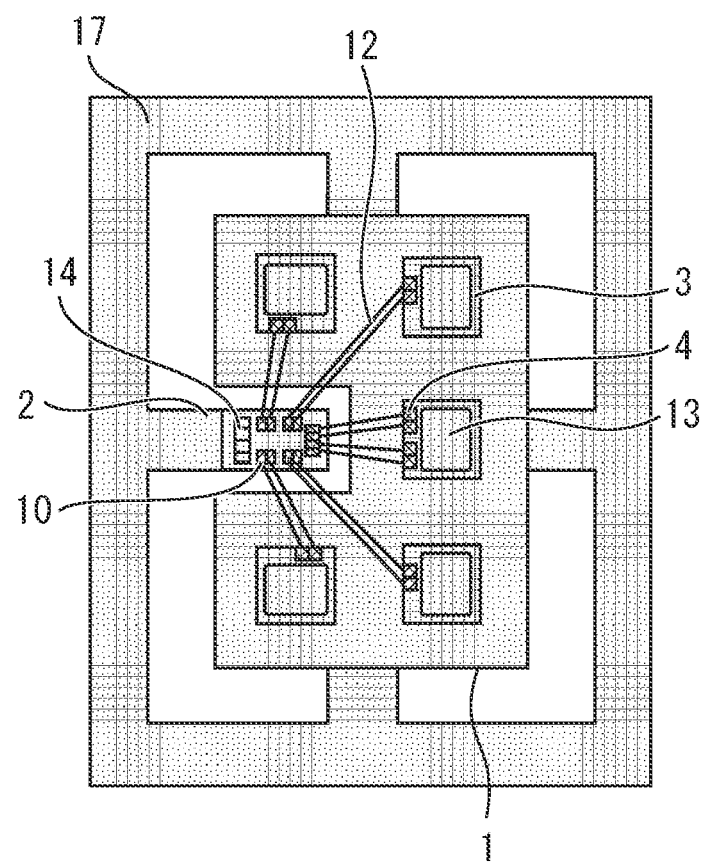
FIG. 10 is a plan view illustrating a manufacturing process of the semiconductor apparatus according to the first embodiment.
Figure 11:
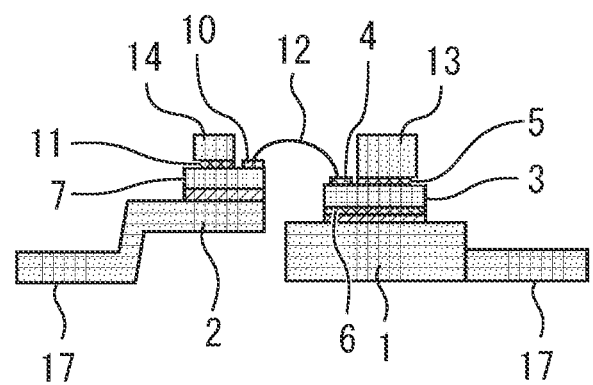
FIG. 11 is a cross-sectional diagram illustrating the manufacturing process of the semiconductor apparatus according to the first embodiment.

Then, as illustrated in FIG. 10 and FIG. 11, the control electrodes 4 of the plurality of semiconductor devices 3 are respectively connected to the plurality of first relay pads 10 through the plurality of metal wires 12. Connection using the metal wires 12 after the first and second conductor blocks 13 and 14 are connected in this manner, eliminates concerns of interference with the metal wires 12 upon connection of the first and second conductor blocks 13 and 14. This expands the variety of jigs which can be used, so that it is possible to easily perform a process of connecting the first and second conductor blocks 13 and 14. Note that a process of connection using the metal wires 12 may be performed before the first and second conductor blocks 13 and 14 are connected. By performing the process of connection using the metal wires 12 first, a range of movement of a wire bond tool for performing wire bonding expands, so that wire bond control is improved.

Figure 12:
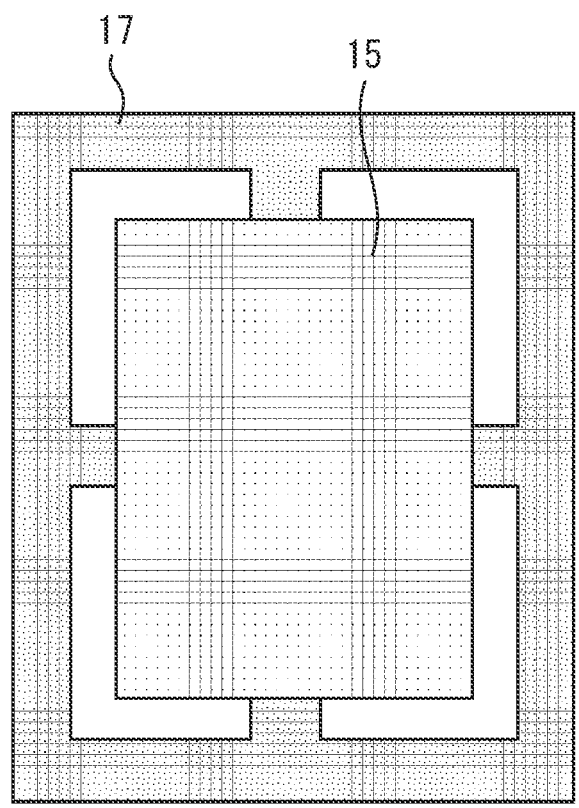
FIG. 12 is a plan view illustrating a manufacturing process of the semiconductor apparatus according to the first embodiment.
Figure 13:
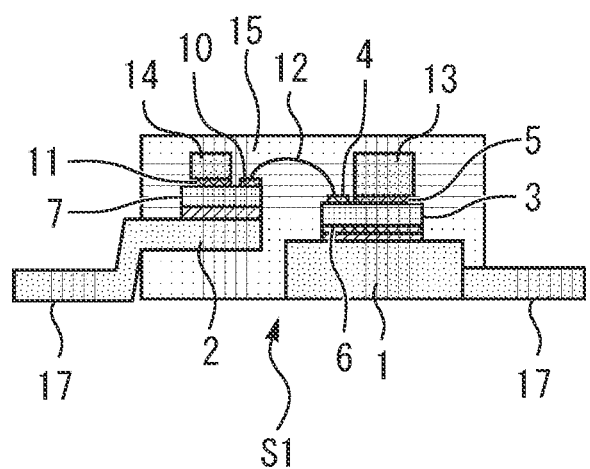
FIG. 13 is a cross-sectional diagram illustrating the manufacturing process of the semiconductor apparatus according to the first embodiment.

Then, as illustrated in FIG. 12 and FIG. 13, the first and second conductor plates 1 and 2, the plurality of semiconductor devices 3, the relay substrate 7, the metal wires 12, and the first and second conductor blocks 13 and 14 are sealed by the sealing material 15. In this event, the first conductor plate 1 is exposed from the first principal surface S1 while the second conductor plate 2 is not exposed from the first principal surface S1.

Figure 14:
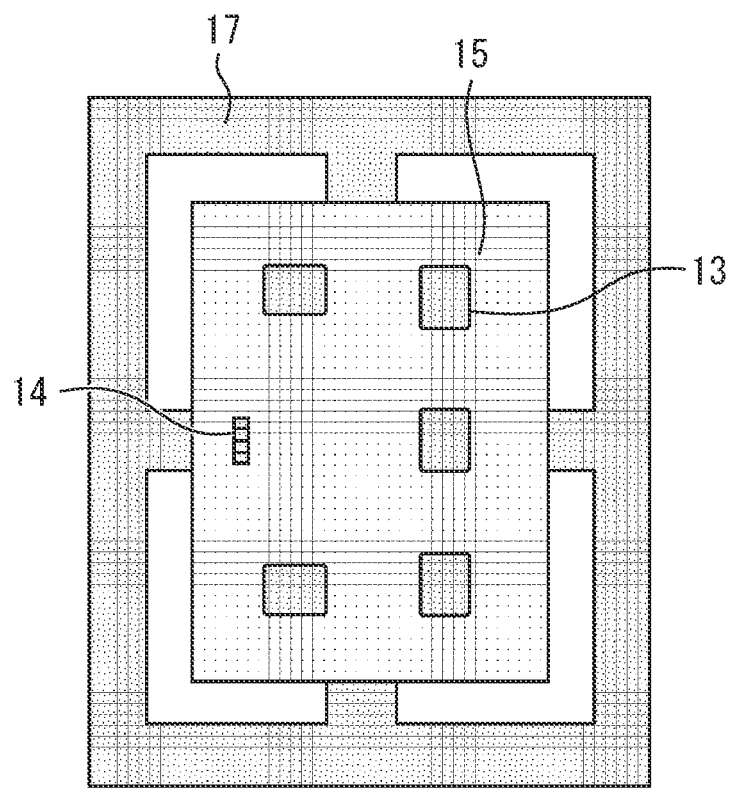
FIG. 14 is a plan view illustrating a manufacturing process of the semiconductor apparatus according to the first embodiment.
Figure 15:
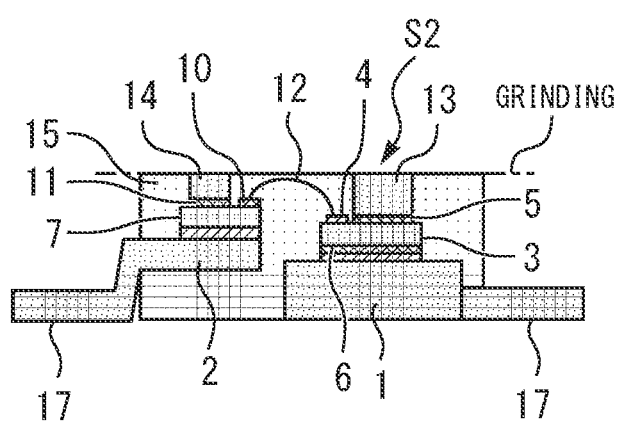
FIG. 15 is a cross-sectional diagram illustrating the manufacturing process of the semiconductor apparatus according to the first embodiment.
Figure 16:
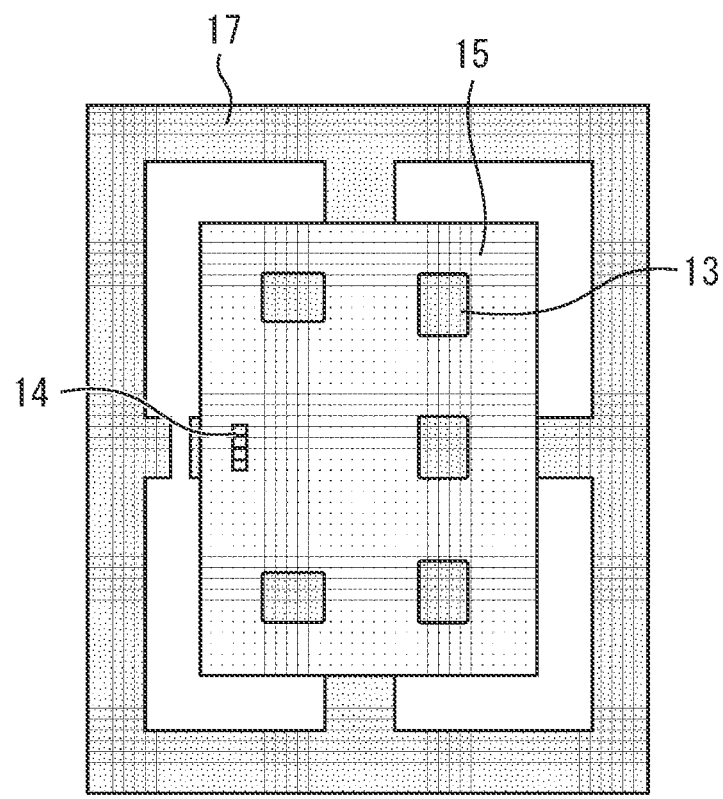
FIG. 16 is a plan view illustrating a manufacturing process of the semiconductor apparatus according to the first embodiment.
Figure 17:
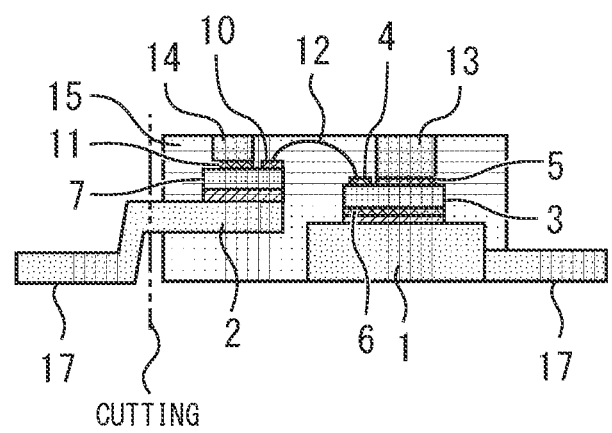
FIG. 17 is a cross-sectional diagram illustrating the manufacturing process of the semiconductor apparatus according to the first embodiment.

Then, as illustrated in FIG. 14 and FIG. 15, the second principal surface S2 of the sealing material 15 is ground so that the first and second conductor blocks 13 and 14 are exposed from the second principal surface S2. Then, as illustrated in FIG. 16 and FIG. 17, a connection portion of the external frame 17 and the second conductor plate 2 which are manufactured as an integrated part is cut to separate the external frame 17 from the second conductor plate 2. Note that upon cutting, a cutting blade is kept away from the sealing material 15 by an interval wider than a blade width. This prevents the sealing material 15 from being damaged upon cutting, so that productivity is improved.

Figure 18:
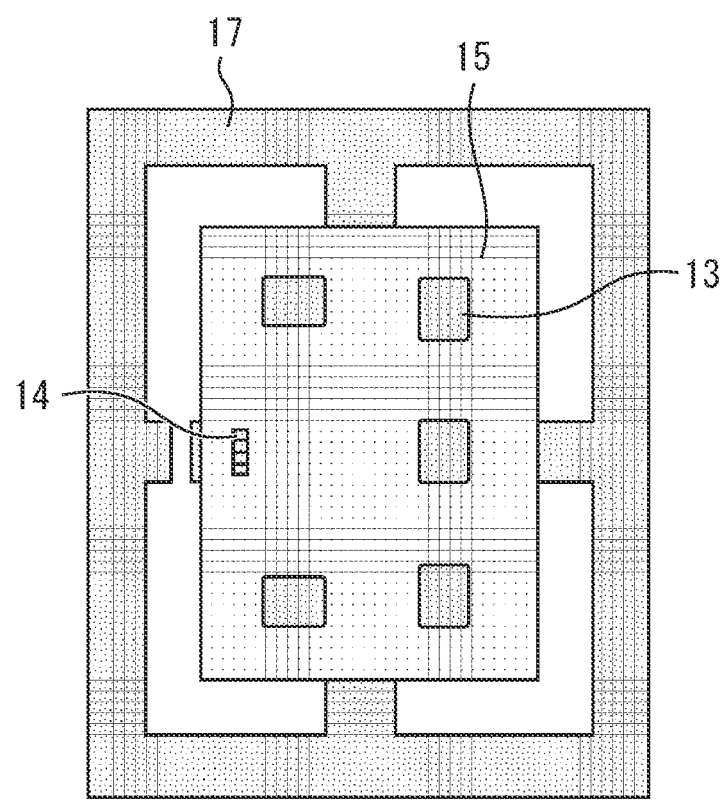
FIG. 18 is a plan view illustrating a manufacturing process of the semiconductor apparatus according to the first embodiment.
Figure 19:
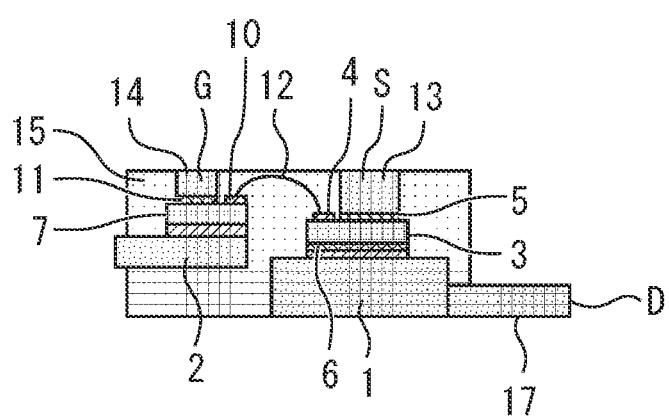
FIG. 19 is a cross-sectional diagram illustrating the manufacturing process of the semiconductor apparatus according to the first embodiment.
Figure 20:
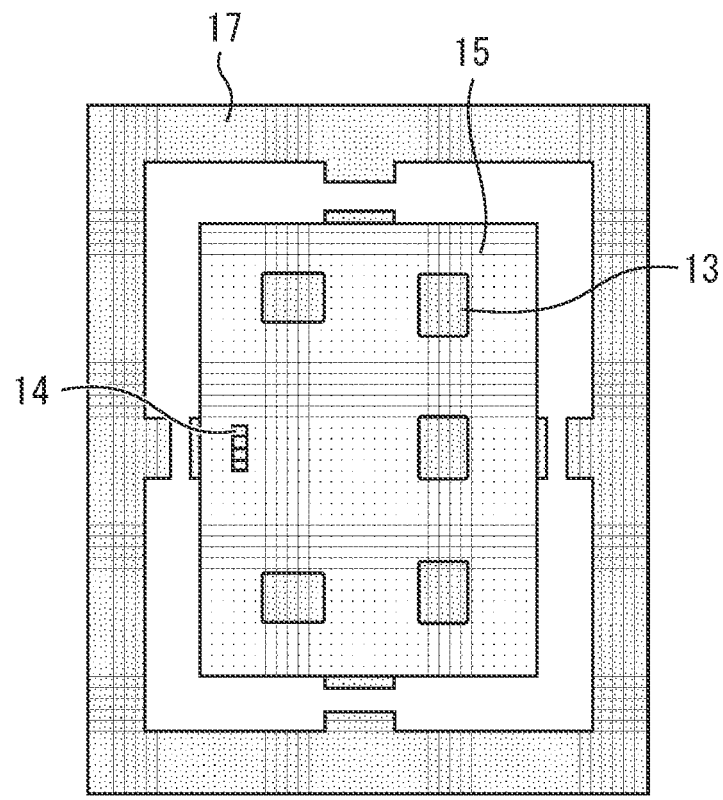
FIG. 20 is a plan view illustrating a manufacturing process of the semiconductor apparatus according to the first embodiment.
Figure 21:
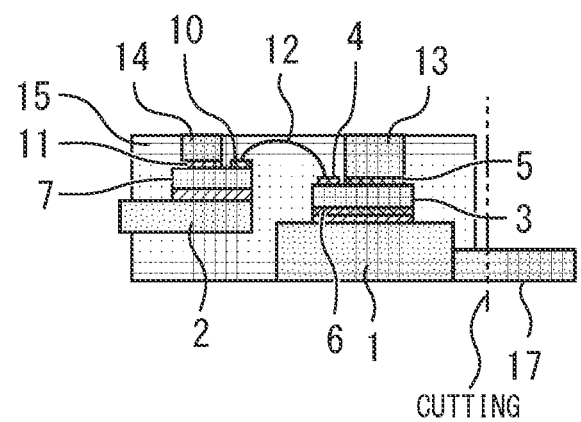
FIG. 21 is a cross-sectional diagram illustrating the manufacturing process of the semiconductor apparatus according to the first embodiment.

Then, as illustrated in FIG. 18 and FIG. 19, a screening test of the semiconductor apparatus for eliminating defective products is implemented by applying a drain voltage which makes the first conductor blocks 13 a source potential to the first conductor plate 1 and applying a gate signal to the second conductor blocks 14. Finally, as illustrated in FIG. 20 and FIG. 21, a connection portion of the external frame 17 and the first conductor plate 1 is cut to separate the external frame 17 from the first conductor plate 1. Note that upon cutting, a cutting blade is kept away from the sealing material 15 by an interval wider than a blade width. This prevents the sealing material 15 from being damaged upon cutting, so that productivity is improved.

Figure 22:
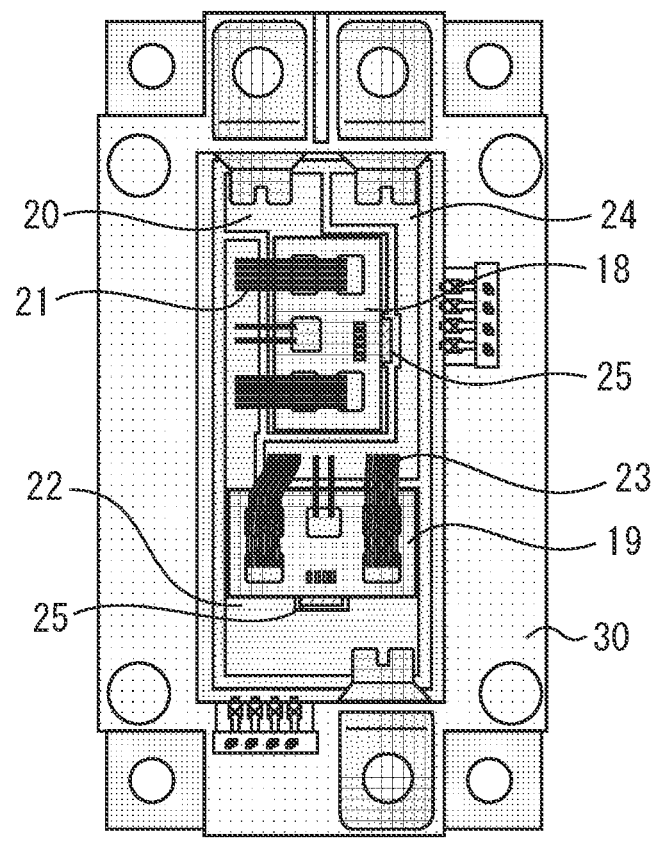
FIG. 22 is a plan view illustrating a power module using a plurality of the semiconductor apparatuses according to the first embodiment.

FIG. 22 is a plan view illustrating a power module using a plurality of the semiconductor apparatuses according to the first embodiment. A first semiconductor apparatus 18 and a second semiconductor apparatus 19 are semiconductor apparatuses described above. The first conductor plate 1 of the first semiconductor apparatus 18 is connected to a first circuit pattern 20 through a joining material such as solder and a sintered material. The first conductor blocks 13 of the first semiconductor apparatus 18 are connected to a second circuit pattern 22 through wirings 21. The first conductor plate 1 of the second semiconductor apparatus 19 is connected to the second circuit pattern 22 through a joining material. The first conductor blocks 13 of the second semiconductor apparatus 19 are connected to a third circuit pattern 24 through wirings 23. In this manner, a half-bridge circuit is constituted using the first semiconductor apparatus 18 and the second semiconductor apparatus 19 respectively as an upper arm and a lower arm. Note that the wirings 21 and 23 may be aluminum or copper wires or ribbons which are joined through ultrasonic joining or may be copper frames which are connected with a joining material such as solder or a sintered material.

A peripheral sealing material 30 such as gel and an epoxy resin seals the first and second semiconductor apparatuses 18 and 19 and the first, second and third circuit patterns 20, 22 and 24 to achieve insulation from outside. The peripheral sealing material 30 achieves insulation between the circuit patterns and insulates exposed surfaces of the second conductor plates 2 exposed from side surfaces of the sealing materials 15 of the first semiconductor apparatus 18 and the second semiconductor apparatus 19, respectively from the second and the third circuit patterns 22 and 24. Further, a cutout portion 25 is provided in the second circuit pattern 22 so as to face the exposed surface of the second conductor plate 2 of the second semiconductor apparatus 19. This makes an insulating distance between the second conductor plate 2 having a source potential and the second circuit pattern 22 having a drain potential longer. In a similar manner, a cutout portion 25 is provided in the third circuit pattern 24 so as to face the exposed surface of the second conductor plate 2 of the first semiconductor apparatus 18. Note that the cutout portion 25 preferably has a size which allows entrance of the peripheral sealing material 30.

As described above, in the present embodiment, the first conductor plate 1 on which the plurality of semiconductor devices 3 are mounted is separated from the second conductor plate 2 on which the relay substrate 7 is mounted, and the first conductor plate 1 and the second conductor plate 2 are sealed by the sealing material 15. Then, the first conductor plate 1 is exposed from the first principal surface S1 of the sealing material 15 while the second conductor plate 2 is not exposed from the first principal surface S1 of the sealing material 15. This can achieve insulation between the first conductor plate 1 and the second conductor plate 2, so that it is possible to easily improve dielectric strength.

Further, the control electrodes 4 of the plurality of semiconductor devices 3 are connected in parallel through the relay substrate 7. The back surface electrodes 6 of the semiconductor devices 3 are drain electrodes, and the front surface electrodes 5 are source electrodes. Thus, the whole semiconductor apparatuses become equivalent to one MOSFET in which the second conductor blocks 14 are gate electrodes, the first conductor blocks 13 are source electrodes, and the first conductor plate 1 is a drain electrode. This can achieve cost reduction by improvement of ease of assembly of the semiconductor apparatus and can achieve a smaller semiconductor apparatus.

Further, in a case where the semiconductor apparatus is connected to the circuit pattern of an insulating substrate, a high potential of the circuit pattern is applied to the first conductor plate 1. On the other hand, a low potential of a lower surface of the relay substrate 7 is applied to the second conductor plate 2. Thus, the dent portion 16 is provided on the first principal surface S1 of the sealing material 15 below the second conductor plate 2. This can make a creepage distance between an exposed portion of the first conductor plate 1 and an exposed portion of the second conductor plate 2 longer, so that it is possible to further improve dielectric strength. However, the dent portion 16 does not have to be provided.

Further, before sealing by the sealing material 15, the first conductor plate 1 and the second conductor plate 2 are integrated with the external frame 17. Thus, the first conductor plate 1 and the second conductor plate 2 are an integrated part until sealing is completed. After sealing by the sealing material 15, the first conductor plate 1 and the second conductor plate 2 are cut from the frame 17. This facilitates manufacturing of the semiconductor apparatus. Further, it is possible to manufacture a plurality of semiconductor apparatuses at a time, so that it is possible to reduce manufacturing cost. Still further, as a result of the first conductor plate 1 and the second conductor plate 2 being integrated with the external frame 17, it is possible to easily control positions of the first conductor plate 1 and the second conductor plate 2, which allows insulation to be easily secured, so that it is possible to improve a yield ratio of the semiconductor apparatus.

Further, a screening test of the semiconductor apparatus is performed to eliminate defective products after the second conductor plate 2 is cut and before the first conductor plate 1 is cut. By performing a screening test before the first conductor plate 1 is cut, drain potentials of a plurality of semiconductor apparatuses can be connected at the same time, so that it is possible to efficiently perform the screening test. Further, accuracy of positions of the first and second conductor blocks 13 and 14 corresponding to the source electrodes and the control electrodes of the plurality of semiconductor apparatuses increases, so that it is possible to easily obtain a potential. As a result of this, screening tests can be performed on the plurality of semiconductor apparatuses at the same time, so that it is possible to reduce manufacturing cost of the semiconductor apparatus.

Second Embodiment

Figure 23:
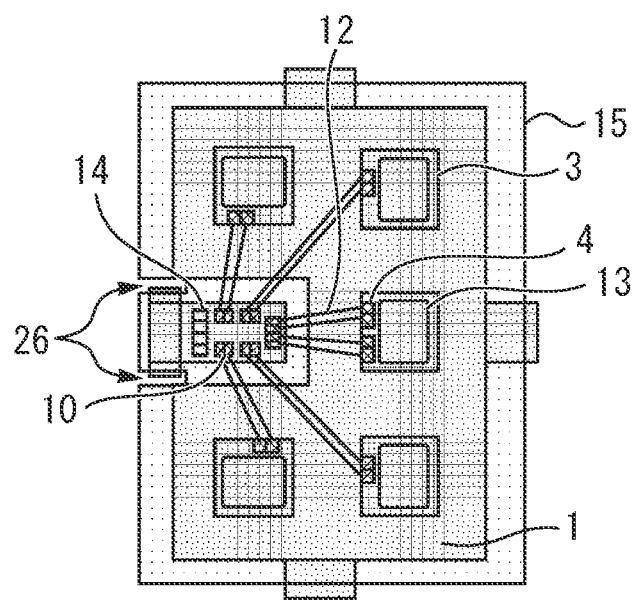
FIG. 23 is a plan view illustrating inside of a semiconductor apparatus according to a second embodiment.

FIG. 23 is a plan view illustrating inside of a semiconductor apparatus according to a second embodiment. Cutout portions 26 are provided in the sealing material 15. The cutout portions 26 are positioned between the separated first conductor plate 1 and the second conductor plate 2. While cut surfaces of the first conductor plate 1 and the second conductor plate 2 are exposed at the cutout portions 26, it is possible to improve insulation between the first conductor plate 1 and the second conductor plate 2 by covering the semiconductor apparatus with the peripheral sealing material 30 when a power module is constituted.

Subsequently, a manufacturing method of the semiconductor apparatus according to the second embodiment will be described. FIGS. 24, 26, 28, 30, 32, 34, 36, 38 and 40 are plan views illustrating a manufacturing process of the semiconductor apparatus according to the second embodiment. FIGS. 25, 27, 29, 31, 33, 35, 37, 39 and 41 are cross-sectional diagrams illustrating the manufacturing process of the semiconductor apparatus according to the second embodiment.

Figure 24:
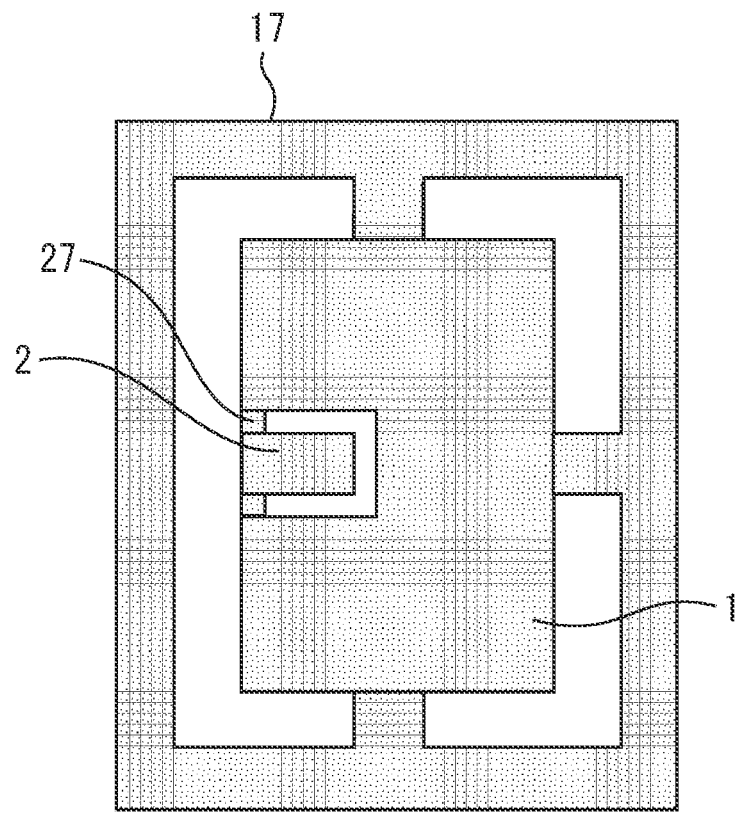
FIG. 24 is a plan view illustrating a manufacturing process of the semiconductor apparatus according to the second embodiment.
Figure 25:
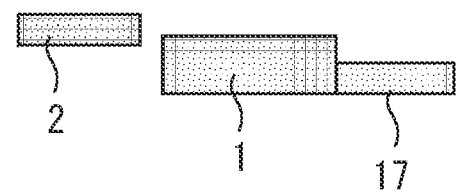
FIG. 25 is a cross-sectional diagram illustrating the manufacturing process of the semiconductor apparatus according to the second embodiment.
Figure 26:
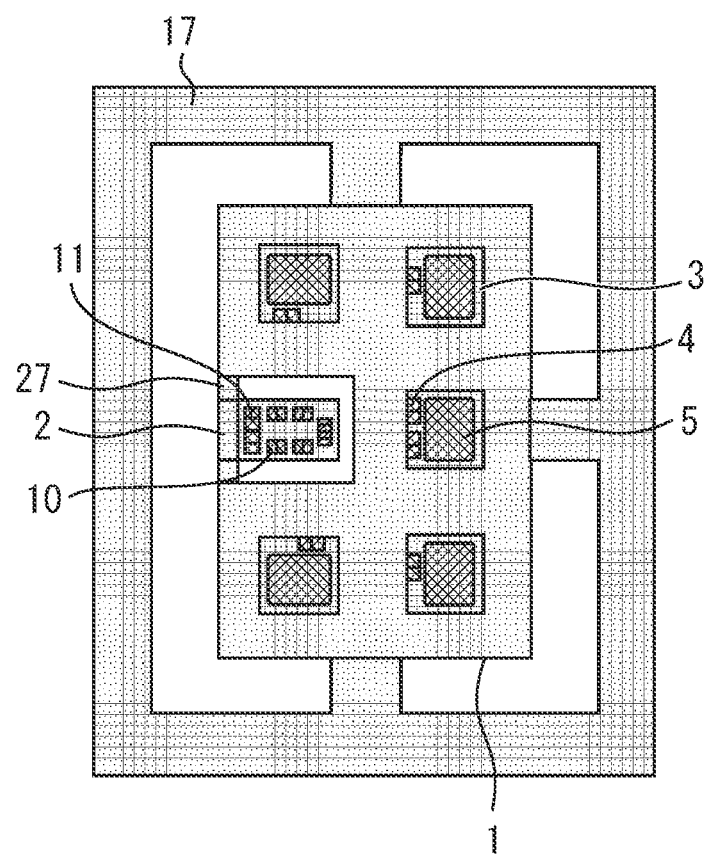
FIG. 26 is a plan view illustrating a manufacturing process of the semiconductor apparatus according to the second embodiment.
Figure 27:
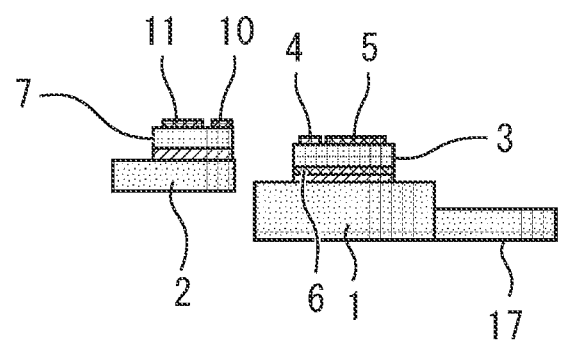
FIG. 27 is a cross-sectional diagram illustrating the manufacturing process of the semiconductor apparatus according to the second embodiment.

First, as illustrated in FIG. 24 and FIG. 25, the first conductor plate 1 and the second conductor plate 2 which are integrated with the external frame 17 and which are connected to each other at bridge portions 27, are prepared. Then, as illustrated in FIG. 26 and FIG. 27, the back surface electrodes 6 of the plurality of semiconductor devices 3 are connected to the first conductor plate 1 through silver, solder, or the like, to connect the plurality of semiconductor devices 3 to the first conductor plate 1. The relay substrate 7 is connected to the second conductor plate 2 in a similar manner.

Figure 28:
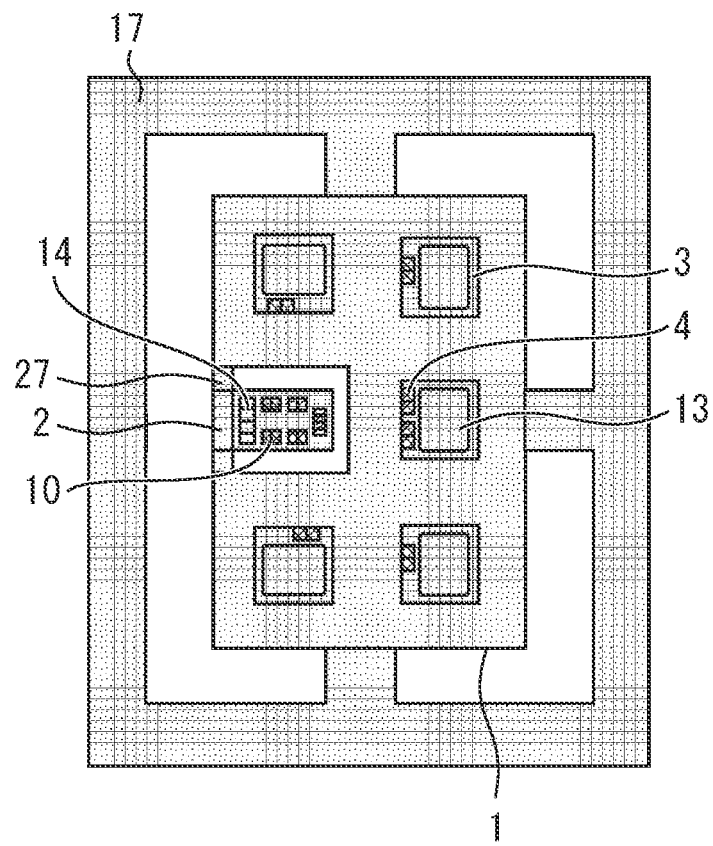
FIG. 28 is a plan view illustrating a manufacturing process of the semiconductor apparatus according to the second embodiment.
Figure 29:
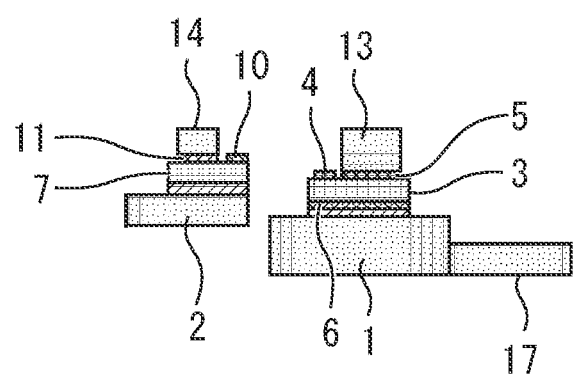
FIG. 29 is a cross-sectional diagram illustrating the manufacturing process of the semiconductor apparatus according to the second embodiment.

Then, as illustrated in FIG. 28 and FIG. 29, the first conductor blocks 13 are connected to the front surface electrodes 5 of the plurality of the semiconductor devices 3. The second conductor blocks 14 are connected to the second relay pad 11.

Figure 30:
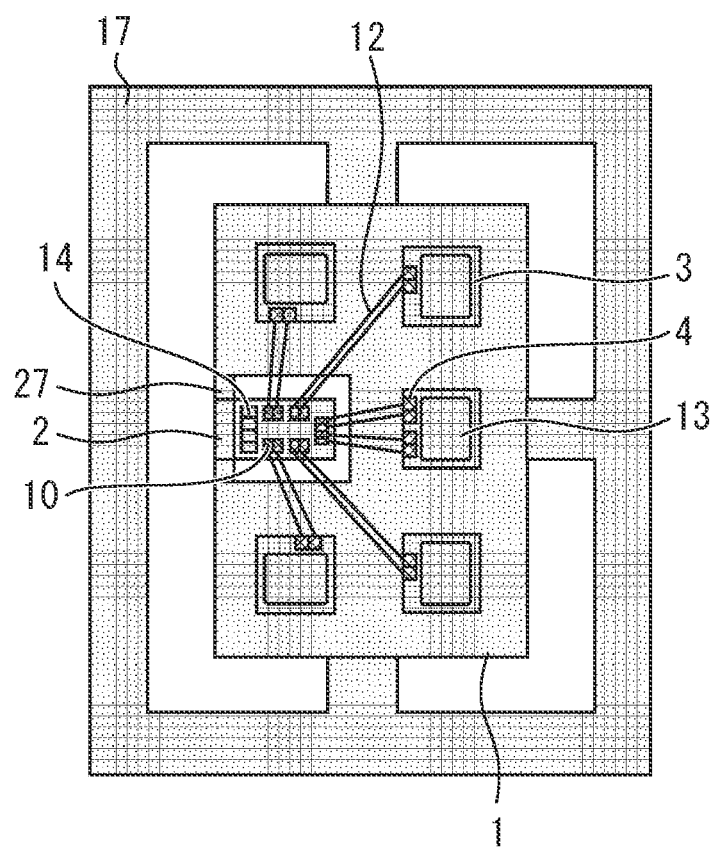
FIG. 30 is a plan view illustrating a manufacturing process of the semiconductor apparatus according to the second embodiment.
Figure 31:
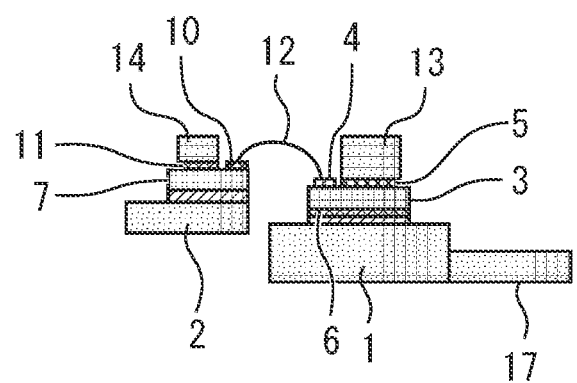
FIG. 31 is a cross-sectional diagram illustrating the manufacturing process of the semiconductor apparatus according to the second embodiment.

Then, as illustrated in FIG. 30 and FIG. 31, the control electrodes 4 of the plurality of semiconductor devices 3 are respectively connected to the plurality of first relay pads 10 through the plurality of metal wires 12.

Figure 32:
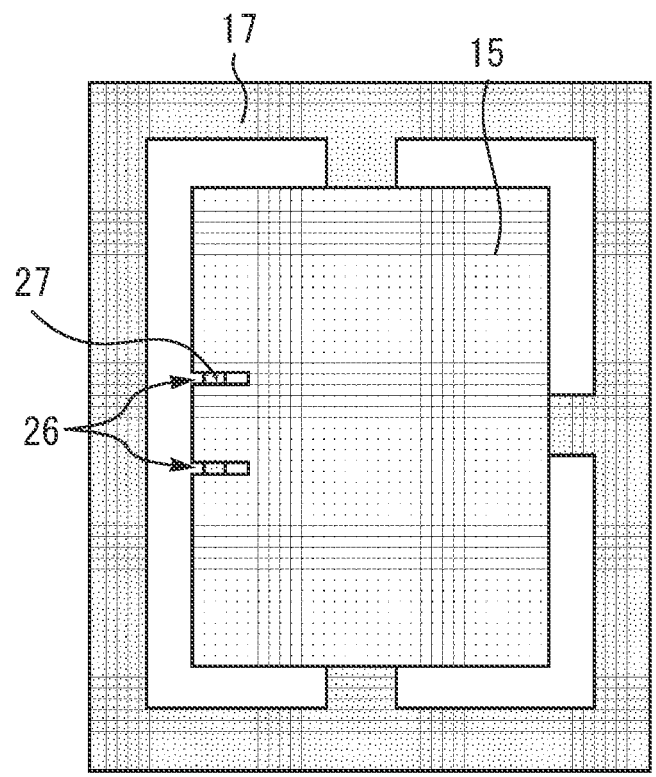
FIG. 32 is a plan view illustrating a manufacturing process of the semiconductor apparatus according to the second embodiment.
Figure 33:
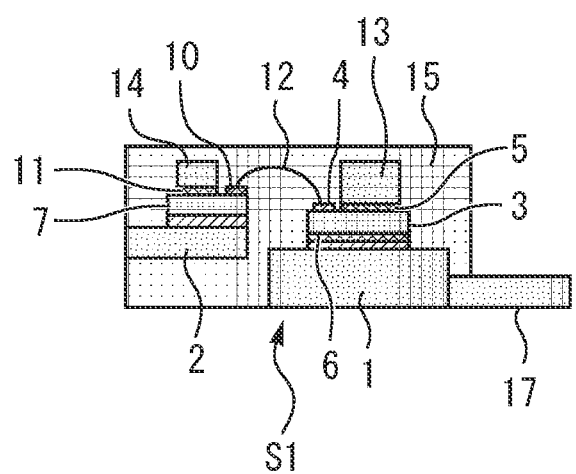
FIG. 33 is a cross-sectional diagram illustrating the manufacturing process of the semiconductor apparatus according to the second embodiment.

Then, as illustrated in FIG. 32 and FIG. 33, the first and second conductor plates 1 and 2, the plurality of semiconductor devices 3, the relay substrate 7, the metal wires 12, and the first and second conductor blocks 13 and 14 are sealed by the sealing material 15. In this event, the cutout portions 26 from which the bridge portions 27 are exposed are provided in the sealing material 15.

Figure 34:
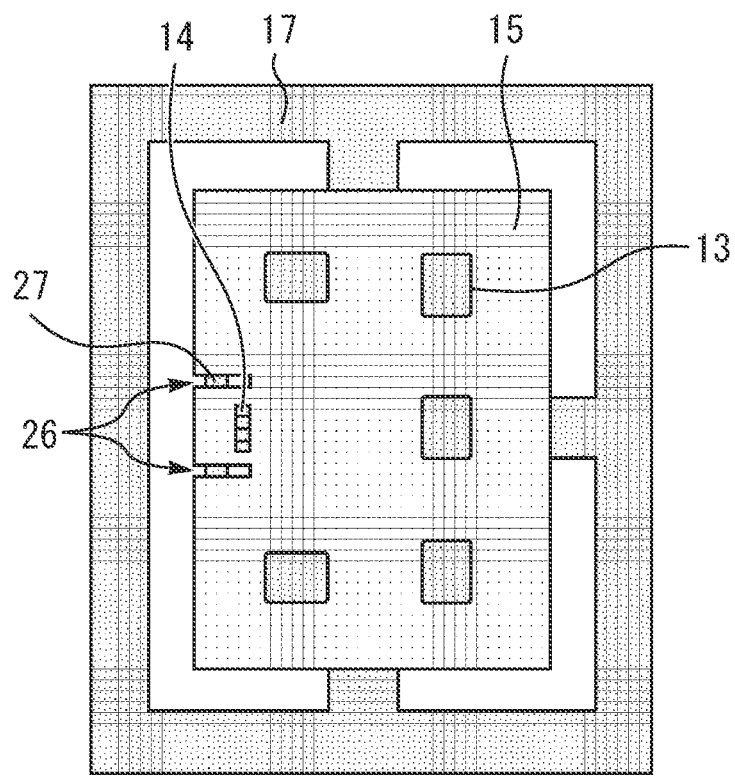
FIG. 34 is a plan view illustrating a manufacturing process of the semiconductor apparatus according to the second embodiment.
Figure 35:
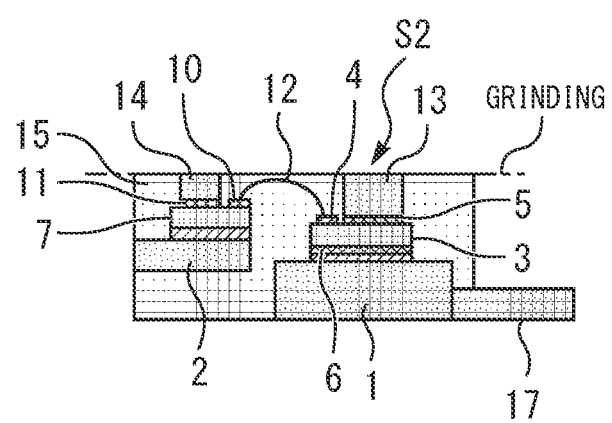
FIG. 35 is a cross-sectional diagram illustrating the manufacturing process of the semiconductor apparatus according to the second embodiment.
Figure 36:
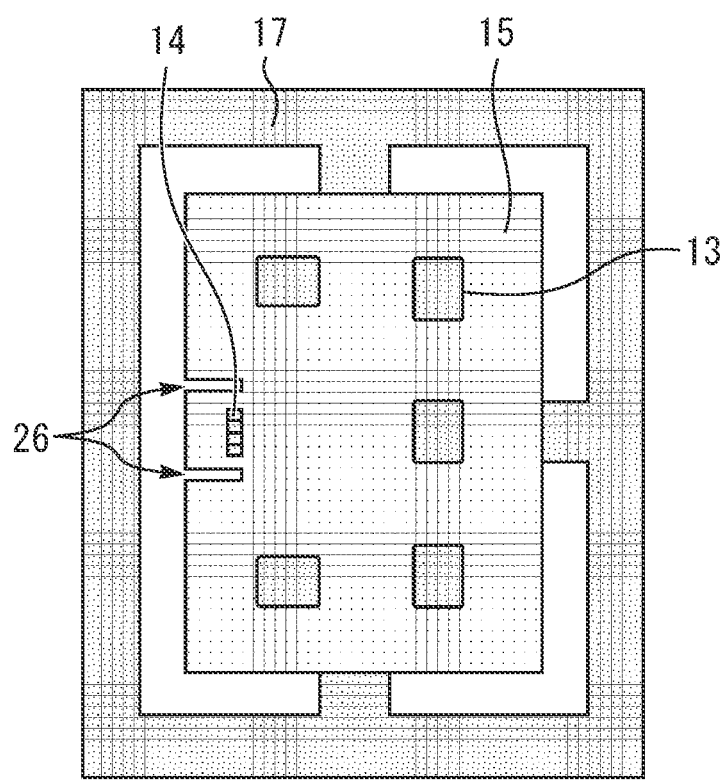
FIG. 36 is a plan view illustrating a manufacturing process of the semiconductor apparatus according to the second embodiment.
Figure 37:
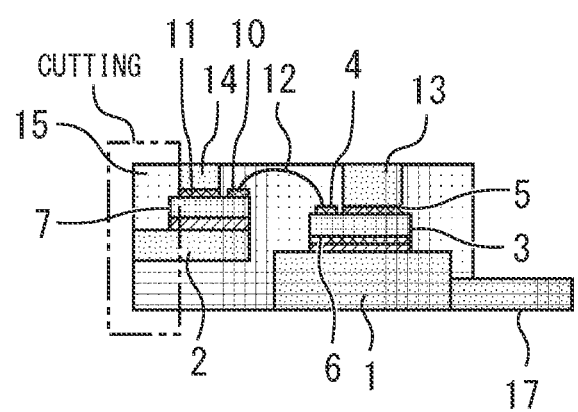
FIG. 37 is a cross-sectional diagram illustrating the manufacturing process of the semiconductor apparatus according to the second embodiment.

Then, as illustrated in FIG. 34 and FIG. 35, the second principal surface S2 of the sealing material 15 is ground, so that the first and second conductor blocks 13 and 14 are exposed from the second principal surface S2. Then, as illustrated in FIG. 36 and FIG. 37, the bridge portions 27 exposed from the cutout portions 26 are cut to separate the first conductor plate 1 from the second conductor plate 2.

Figure 38:
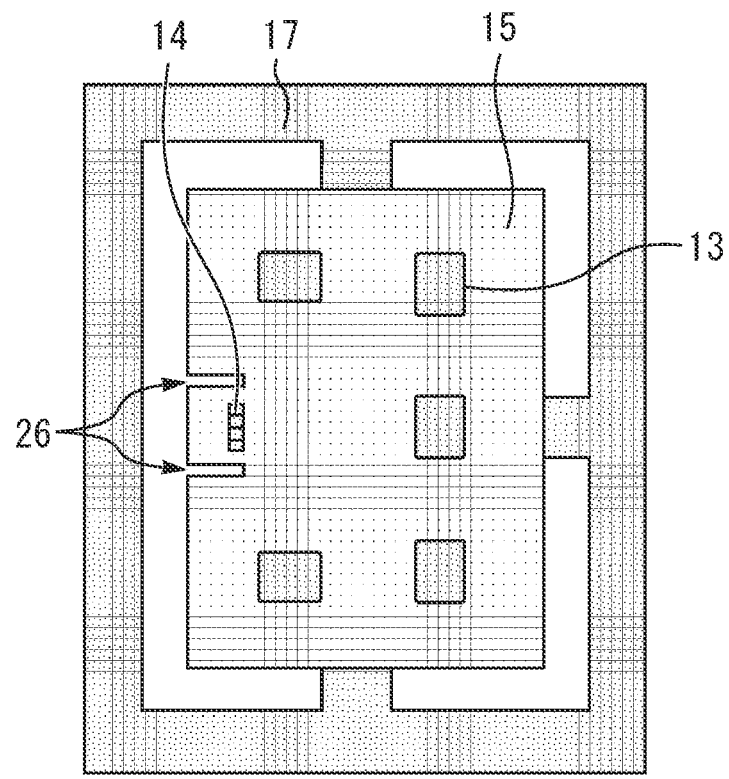
FIG. 38 is a plan view illustrating a manufacturing process of the semiconductor apparatus according to the second embodiment.
Figure 39:
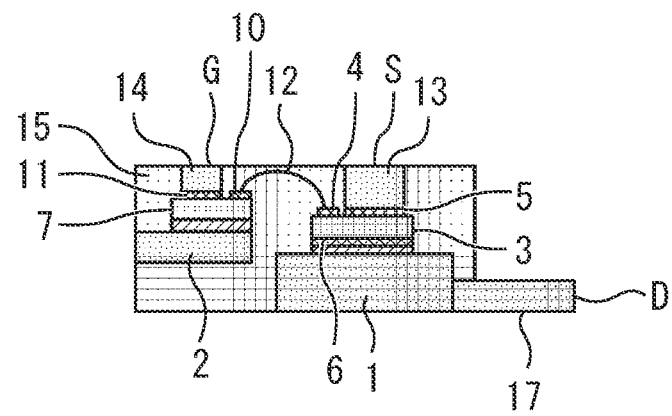
FIG. 39 is a cross-sectional diagram illustrating the manufacturing process of the semiconductor apparatus according to the second embodiment.
Figure 40:
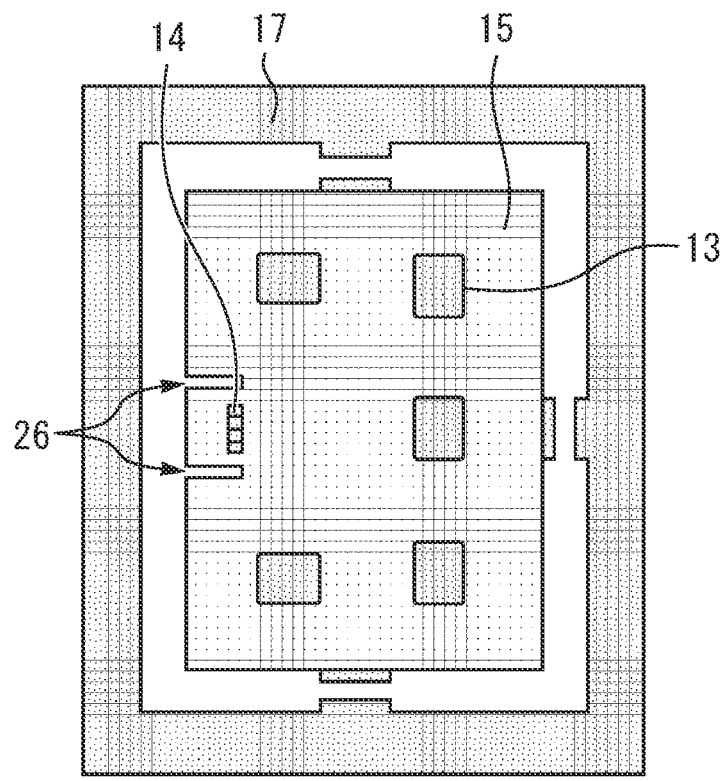
FIG. 40 is a plan view illustrating a manufacturing process of the semiconductor apparatus according to the second embodiment.
Figure 41:
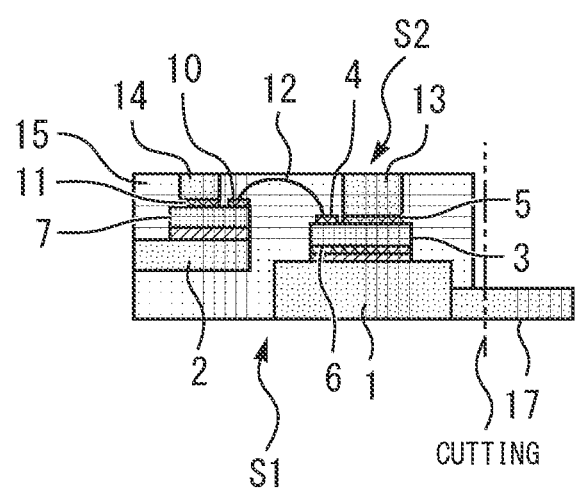
FIG. 41 is a cross-sectional diagram illustrating the manufacturing process of the semiconductor apparatus according to the second embodiment.

Then, as illustrated in FIG. 38 and FIG. 39, the first conductor blocks 13 are electrically connected to the front surface electrodes 5 which are source electrodes, and the first conductor plate 1 is electrically connected to the back surface electrodes 6 which are drain electrodes. Further, the second conductor blocks 14 are electrically connected to the control electrodes 4 which are gate electrodes. A screening test of the semiconductor apparatus is performed to eliminate defective products by applying a voltage between the source electrodes and the drain electrodes by applying a voltage between the first conductor blocks 13 and the first conductor plate 1, and by applying a voltage to the gate electrodes by applying a voltage to the second conductor blocks 14. In this event, insulation between the first conductor plate 1 and the second conductor plate 2 may be secured by putting an insulating plate, or the like, at the cutout portions 26. Finally, as illustrated in FIG. 40 and FIG. 41, a connection portion of the external frame 17 and the first conductor plate 1 is cut to separate the external frame 17 from the first conductor plate 1.

As described above, in the present embodiment, the second conductor plate 2 is connected to the first conductor plate 1 at the bridge portions 27 instead of at the external frame 17. Thus, the first conductor plate 1 and the second conductor plate 2 are more firmly fixed, and the second conductor plate 2 is less warped by a pressing force upon wire bonding, so that a yield ratio is improved.

Further, in a case where a material of the wire is Au, or the like, there is a case where the material is heated. By connecting the first conductor plate 1 and the second conductor plate 2 at the bridge portions 27, temperatures of the both can be made uniform, so that bondability of the wire bond is improved.

Third Embodiment

Figure 42:
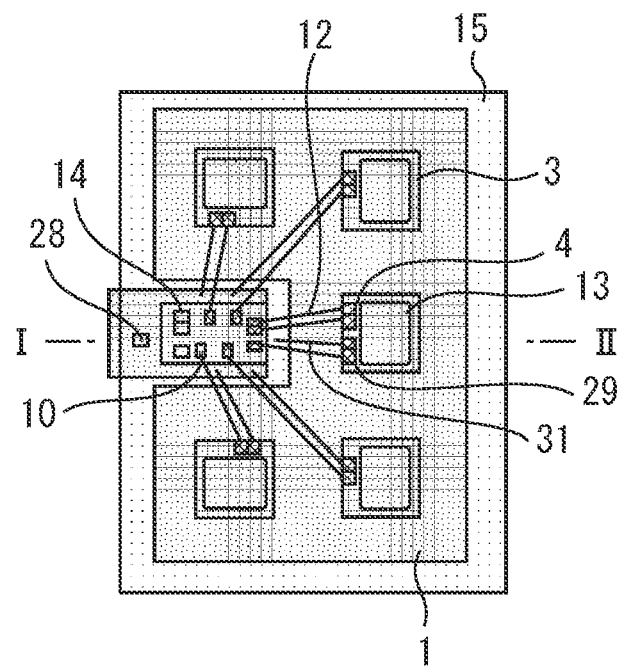
FIG. 42 is a plan view illustrating inside of a semiconductor apparatus according to a third embodiment.
Figure 43:
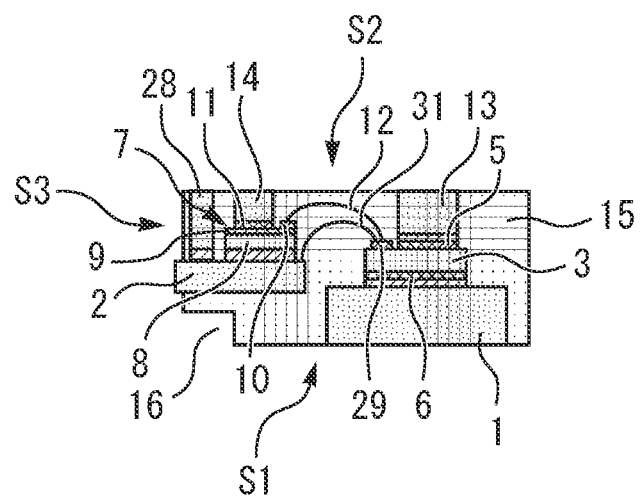
FIG. 43 is a cross-sectional diagram along I-II in FIG. 42.

FIG. 42 is a plan view illustrating inside of a semiconductor apparatus according to a third embodiment. FIG. 43 is a cross-sectional diagram along I-II in FIG. 42. A source conductor block 28 is connected to the second conductor plate 2. Source pads 29 of the plurality of semiconductor devices 3 are connected to the second conductor plate 2 through wires 31. The first relay pad 10 and the second relay pad 11 of the relay substrate 7 are insulated from the second conductor plate 2 and the source conductor block 28 by the insulating film 9. Note that a plurality of source conductor blocks 28 may be provided.

The source conductor block 28 is exposed from the second principal surface S2 of the sealing material 15 and functions as a source control electrode. This can fix the second conductor plate 2 at a source potential, so that it is possible to eliminate a portion which becomes floating. Thus, even if the semiconductor apparatus performs switching at fast speed, and a voltage steeply oscillates, it is possible to prevent improper voltage breakdown. Note that it is also possible to use an exposed portion of the second conductor plate 2 as a source control electrode in place of the source conductor block 28. In this case, part of the second conductor plate 2 may be deformed so that the second conductor plate 2 is exposed at an appropriate position as the source control electrode. Further, a source pad and its routing wirings at the relay substrate 7 can be eliminated, so that it is possible to reduce a size of the relay substrate 7.

The semiconductor device 3 is not limited to a device formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor apparatus in which the semiconductor device is incorporated. Further, since the semiconductor device has a high heat resistance, a radiation fin of a heatsink can be miniaturized and a water-cooled part can be air-cooled, which leads to further miniaturization of the semiconductor apparatus. Further, since the semiconductor device has a low power loss and a high efficiency, a highly efficient semiconductor apparatus can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-009779, filed on Jan. 25, 2021 including specification, claims, drawings and summary, on which the convention priority of the present application is based, is incorporated herein by reference in its entirety.

The invention claimed is:

1. A semiconductor apparatus comprising:
   a first conductor plate;
   a second conductor plate separated from the first conductor plate;
   a plurality of semiconductor devices having back surface electrodes connected to the first conductor plate;
   a relay substrate mounted on the second conductor plate and including a plurality of first relay pads and a second relay pad connected to the plurality of first relay pads;
   a plurality of metal wires respectively connecting control electrodes of the plurality of semiconductor devices to the plurality of first relay pads;
   a first conductor block connected to front surface electrodes of the plurality of semiconductor devices;
   a second conductor block connected to the second relay pad; and
   a sealing material sealing the first and second conductor plates, the plurality of semiconductor devices, the relay substrate, the metal wire, and the first and second conductor blocks,
   the sealing material includes a first principal surface and a second principal surface opposed to each other,
   the first conductor plate is exposed from the first principal surface,
   the second conductor plate is not exposed from the first principal surface, and
   the first and second conductor blocks are exposed from the second principal surface.

2. The semiconductor apparatus according to claim 1, wherein the back surface electrode is a drain electrode, and the front surface electrode is a source electrode.

3. The semiconductor apparatus according to claim 1, wherein a dent portion is provided on the first principal surface of the sealing material below the second conductor plate.

4. The semiconductor apparatus according to claim 1, further comprising a source conductor block connected to the second conductor plate and exposed from the second principal surface of the sealing material.

5. The semiconductor apparatus according to claim 1, wherein the semiconductor device is formed of a wide-bandgap semiconductor.

6. A power module comprising:
   first and second apparatuses which are the semiconductor apparatuses according to claim 1;
   a first circuit pattern connected to the first conductor plate of the first semiconductor apparatus;
   a second circuit pattern connected to the first conductor block of the first semiconductor apparatus and the first conductor plate of the second semiconductor apparatus;
   a third circuit pattern connected to the first conductor block of the second semiconductor apparatus; and
   a peripheral sealing material sealing the first and second semiconductor apparatuses and the first, second and third circuit patterns.

7. The power module according to claim 6, wherein a cutout portion is provided in the second circuit pattern so as to face an exposed surface of the second conductor plate exposed from a side surface of the sealing material of the second semiconductor apparatus.

8. A manufacturing method of the semiconductor apparatus comprising:
   mounting a plurality of semiconductor devices on a first conductor plate and connecting back surface electrodes of the plurality of semiconductor devices to the first conductor plate;
   mounting a relay substrate, which includes a plurality of first relay pads and a second relay pad connected to the plurality of first relay pads, on a second conductor plate separated from the first conductor plate;
   connecting a first conductor block to front surface electrodes of the plurality of semiconductor devices;
   connecting a second conductor block to the second relay pad;
   respectively connecting control electrodes of the plurality of semiconductor devices to the plurality of first relay pads through a plurality of metal wires; and
   sealing the first and second conductor plates, the plurality of semiconductor devices, the relay substrate, the metal wire, and the first and second conductor blocks by a sealing material,
   wherein the sealing material includes a first principal surface and a second principal surface opposed to each other,
   the first conductor plate is exposed from the first principal surface,
   the second conductor plate is not exposed from the first principal surface, and
   the first and second conductor blocks are exposed from the second principal surface.

9. The manufacturing method of the semiconductor apparatus according to claim 8, wherein before sealing by the sealing material, the first conductor plate and the second conductor plate are integrated with a frame, and
   after sealing by the sealing material, the first conductor plate and the second conductor plate are cut from the frame.

10. The manufacturing method of the semiconductor apparatus according to claim 9, wherein a screening test of the semiconductor apparatus is performed after the second conductor plate is cut and before the first conductor plate is cut.

11. The manufacturing method of the semiconductor apparatus according to claim 8, wherein before sealing by the sealing material, the first conductor plate and the second conductor plate are connected to each other at a bridge portion,
    upon sealing by the sealing material, a cutout portion from which the bridge portion is exposed is provided in the sealing material, and
    after sealing by the sealing material, the bridge portion exposed from the cutout portion is cut.

* * * * *